United States Patent
Okuno

[19]

[11] Patent Number: 6,110,274
[45] Date of Patent: Aug. 29, 2000

[54] PROCESS AND APPARATUS FOR PRODUCING POLYCRYSTALLINE SEMICONDUCTOR

[75] Inventor: Tetsuhiro Okuno, Shiki-gun, Japan

[73] Assignee: Sharp Kabushiki Kaisha, Osaka, Japan

[21] Appl. No.: 09/108,371

[22] Filed: Jul. 1, 1998

[30] Foreign Application Priority Data

Jul. 2, 1997 [JP] Japan ................................. 9-177360

[51] Int. Cl.$^7$ ............................................... C30B 13/20
[52] U.S. Cl. ................................ 117/81; 83/217; 83/222
[58] Field of Search ................................ 117/81, 83, 206, 117/217, 222

[56] References Cited

U.S. PATENT DOCUMENTS

| 3,898,051 | 8/1975 | Schmid . |
| 4,175,610 | 11/1979 | Zauhar et al. . |
| 4,944,925 | 7/1990 | Yamachi et al. . |
| 5,268,061 | 12/1993 | Sunwoo et al. . |
| 5,714,004 | 2/1998 | Okuno ........................... 117/3 |
| 5,849,080 | 12/1998 | Okuno ......................... 117/222 |

FOREIGN PATENT DOCUMENTS

| 0463229 | 1/1992 | European Pat. Off. . |
| 0748884 | 12/1996 | European Pat. Off. . |
| 08781865 | 7/1997 | European Pat. Off. . |
| 0186249 | 7/1998 | European Pat. Off. . |
| 2255950 | 7/1975 | France . |
| 3323896 | 1/1985 | Germany . |
| 4236827 | 5/1995 | Germany . |
| 57-21515B2 | 5/1982 | Japan . |
| 58-54115B2 | 12/1983 | Japan . |
| 62-260710A | 11/1987 | Japan . |
| 2279585 | 1/1995 | United Kingdom . |

OTHER PUBLICATIONS

Kyojiro Kaneko—"Continuous Casting of Multicrystalline Cilicon Ingot by Electromagnetic Casting", JPN J. Applied Physics, vol. 64.7 (1995), pp. 682–685.

*Primary Examiner*—Felisa C. Hiteshew
*Attorney, Agent, or Firm*—Birch, Stewart, Kolasch & Birch, LLP

[57] ABSTRACT

A process and apparatus for producing a high-quality polycrystalline semiconductor ingot with excellent crystallographic properties are disclosed. The interior of an airtight vessel is kept in an inert atmosphere for semiconductors. A raw semiconductor material is charged in a crucible, and the raw semiconductor material is heated by an induction heating coil so as to be melted. Then the bottom of the crucible is deprived of heat for causing the raw semiconductor material to solidify, thereby producing a polycrystalline semiconductor. The semiconductor crystal grows in one direction from the bottom to the top of the crucible while the heat emission is changed in accordance with a predetermined relationship for keeping the solidification rate of the raw semiconductor material constant.

21 Claims, 13 Drawing Sheets

PROCESS AND APPARATUS FOR PRODUCING POLYCRYSTALLINE SEMICONDUCTOR

BACKGROUND OF THE INVENTION

1. Field of the Invention

The present invention relates to a process and apparatus for producing a polycrystalline semiconductor, or more particularly to a process and an apparatus for producing a polycrystalline silicon semiconductor having a small strain under stress.

2. Description of the Related Art

Silicon is an excellent raw material for production of industrial products, and is used, for example, as a semiconductor material for preparation of ICs (integrated circuits), etc., and as a material for preparation of solar cells; it is a really excellent material from the standpoint of a resource that finds many applications in these areas. More specifically, silicon is the material used for almost all the solar cell materials now in practical use. The currently dominating solar cells for power supply are based on single-crystal silicon, and thus further development of solar cells made of high-quality polycrystalline silicon is neccessary for cost reduction. Under the circumstances, the conversion efficiency of polycrystalline silicon is lower than that of single-crystal silicon. Therefore, development of a high-quality polycrystalline silicon is the foremost requirement for successful applications to solar cells.

According to the conventional process for producing polycrystalline silicon semiconductors, solid silicon inserted to a silica crucible is melted in a heating furnace, and is then cast into a graphite crucible. Another recently known method is melting in a vacuum or in an inert gas to prevent mixing of oxygen or nitrogen gas, etc. into the silicon to thereby improve the quality and prevent dusting.

In a semi-continuous casting furnace method of Wacker-Chemitronie GmbH in Germany, for example, silicon is melted in a vacuum or in an inert gas in a silicon crucible, and is then poured into a mold made of graphite or the like by inclining the crucible (Japanese Examined Patent Publication JP-B2 57-21515(1982)). In HEM (Heat Exchange Method) of Crystal Systems, Inc. in the U.S., silicon is melted in a vacuum in a silica crucible, and is then solidified directly (Japanese Examined Patent Publication JP-B2 58-54115(1983)). Also, there is known an improvement of the Wacker' process, wherein an water-cooled steel plate is used for the silicon melting crucible (Japanese Unexamined Patent Publication JP-A 62-260710(1987)).

In any above-mentioned silicon processes, the heat emission during solidification process of the silicon semiconductor is controlled for keeping it constant. As a result, when compared to initial stages where the silicon is solidified to transit to a solid phase from a liquid phase, more heat is transmitted through the solid phase thus occupying a large part in last stages. Since solid silicon has a higher thermal resistance than liquid silicon, however, it is difficult to discharge the heat emitted during the solidification process, resulting in a lower growth rate. Unless the growth rate is constant, a strain or a defect is liable to occur and deteriorates the crystal quality. For example, EPD (etch pit density), an index for evaluating the quality of crystal products, is normally about $10^5/cm^2$ for polycrystal silicon, which is much higher than the figure of less than $10^2/cm^2$ for single crystal.

In view of this, an attempt has been made to improve EPD by annealing. In the process disclosed by JP-B2 58-54115, for example, the crucible temperature is regulated for annealing after solidification (See the same patent publication, column 2, lines 33–36). A semiconductor ingot generally has a relatively large shape of about 30 to 50 cm square. The annealing of the s emiconductor ingot after the ingot has solidified, therefore, causes a temperature difference between the central portion and the peripheral portion of the ingot during the annealing process. The result is that the annealing process aimed at releasing the strain stress rather tends to generate a strain. The effect of the annealing process, therefore, cannot be substantially expected, and the polycrystal thus produced is of course liable to have a higher EPD.

For further improving the above-mentioned attempt, the applicant of the invention has applied for a patent on a process and an apparatus for producing a polycrystalline semiconductor having excellent crystallographic properties and having a small strain under stress by executing the solidification and the annealing alternatively (Japanese Patent application No. 7-344136(1995)). In this process, however, the heat emission is actually constant over the entire period from initial to last stages of the growth of crystal, resulting in a lower growth rate in the last stages than in the initial stages of solidification. Consequently, it is considered that one half of the effectiveness of the annealing is lost.

SUMMARY OF THE INVENTION

The present invention has been made in view of the above-mentioned situation, and the object thereof is to provide a process and an apparatus for producing a polycrystalline semiconductor having excellent crystallographic properties and having a smaller strain under stress and fewer defects.

Throughout the specification and the claims, "under an inert atmosphere" means "in a vacuum or under an atmosphere of an inert gas which prevents oxidation of the heated raw semiconductor material present" which is realized in an airtight vessel.

The invention provides a process for producing a polycrystalline semiconductor comprising the steps of:

charging a raw semiconductor material into a crucible in an atmosphere inert to the semiconductor;

heating and melting the raw semiconductor material in the crucible by heating means;

solidifying the melted raw semiconductor material while depriving the bottom of the crucible of heat; and then cooling the solidified semiconductor while cooling the crucible, wherein a relationship between heat emission and solidification rate at which rate a solid-liquid interface of the raw semiconductor material moves is previously determined, and when solidifying the melted raw semiconductor material, a heat emission is changed with time according to the predetermined relationship so as to keep the solidification rate constant.

According to the invention, when solidifying the melted raw semiconductor material, the heat emission is changed with time according to the predetermined relationship between solidification rate and heat emission for assuring a constant solidification rate at which rate the solid-liquid interface of the raw semiconductor material moves. Since the solidification rate is kept constant, the growth rate of the semiconductor crystal is also kept constant, thus making it possible to producing a polycrystalline semiconductor with excellent crystallographic properties, a smaller strain under stress and few defects.

The invention is characterized in that solidification at the constant rate and annealing are alternatively executed during the solidifying step.

According to the invention, since the solidification at the constant rate and the annealing are alternatively executed, it is possible to further reduce the strain under stress.

The invention is characterized in that the change in the heat emission is controlled on the basis of a detection value of a temperature change between an inlet and an outlet for a cooling medium which deprives the crucible bottom of heat.

According to the invention, the cooling medium which deprives the crucible bottom of heat undergoes a change in temperature corresponding to the heat emission. By detecting the temperature change between the inlet and the outlet for the cooling medium, it is possible to easily detect and thus control the change in the heat emission.

The invention is characterized in that the change in the heat emission is controlled so that the heat emission increases from initial stages toward last stages of the solidifying step.

According to the invention, even when solidification of the semiconductor material has proceeded to increase the proportion of the heat emission through the solidified part having a lower heat conductivity than the liquid part, it is possible to keep the solidification rate constant by increasing the heat emission.

The invention is characterized in that the increasing of the heat emission is controlled in accordance with a linear function.

According to the invention, since the heat emission is controlled to be increased in accordance with the linear function as the solidification proceeds, it is possible to produce a polycrystalline semiconductor with small strain under stress by applying a simple control.

The invention is characterized in that the change in the heat emission is controlled by regulating a flow rate of a cooling medium which deprives the crucible bottom of heat.

According to the invention, increase or decrease of the heat emission can be easily regulated by increasing or decreasing the flow rate of the cooling medium which deprives the crucible bottom of heat.

The invention is characterized in that the bottom of the crucible is placed on a supporting bed having a hollow structure, whereby the change in the heat emission is controlled by regulating heat to be deprived from the crucible bottom by inserting into or drawing out from the hollow structure, or beat insulator piece.

According to the invention, when the heat insulator piece is inserted into the hollow structure of the supporting bed on which the crucible bottom is placed, the radiative heat transmission in the hollow structure is suppressed thereby to reduce the heat emission. When the heat insulator is drawn out from the hollow structure, on the other hand, the radiative heat transmission is less suppressed, thereby making it possible to increase the heat emission.

The invention is characterized in that semiconductor seed crystals are placed on the bottom of the crucible before charging the raw semiconductor material into the crucible, whereby the polycrystal is grown from the seed crystals at the time of solidification.

According to the invention, a polycrystalline semiconductor with excellent crystallographic properties can be grown from the seed crystals.

The invention is characterized in that the raw semiconductor material is polysilicon and the polycrystalline semiconductor is polycrystalline silicon.

According to the invention, polysilicon is preferable as the raw semiconductor material, and in which case the polycrystalline semiconductor to be produced is polycrystalline silicon. Since a constant solidification rate can be secured, a less strain occurs under stress. As a result, a polycrystalline silicon having such excellent crystallographic properties as to be applicable for a solar cell with a high conversion efficiency can be grown.

The invention provides an apparatus for producing a polycrystalline semiconductor comprising:

an airtight vessel capable of keeping therein an atmosphere inert to the semiconductor;

a crucible arranged in the airtight vessel, into which a raw semiconductor material is charged;

heating means for heating the crucible at upper portions of a bottom of the crucible to melt the raw semiconductor material;

a supporting bed for mounting the crucible thereon by supporting an under side of the bottom of the crucible;

cooling means for cooling the supporting bed;

driving means for driving the supporting bed so as to rotate about a vertical axis, as well as to move up or down; and heat emission controlling means for controlling a heat emission in accordance with a predetermined relationship between solidification rate and heat emission so as to keep the solidification rate constant at the time of solidification of the raw semiconductor material.

According to the invention, a raw semiconductor material is charged into the crucible under an inert atmosphere for semiconductors, and the raw semiconductor material is heated and melted in the crucible by heating means. After the raw semiconductor material has melted, the melted material is solidified while the cooling means deprives the crucible bottom of heat, thereby producing a polycrystalline semiconductor solidified in one direction from the bottom to the top of the crucible. The heat emission from the semiconductor material is controlled in accordance with a predetermined relationship between solidification rate and heat emission. Therefore, it is possible to produce a polycrystalline semiconductor having excellent crystallographic properties and a smaller strain under stress.

The invention is characterized in that the supporting bed has a hollow structure into which a heat insulator can be inserted or from which the heat insulator can be drawn out.

According to the invention, by inserting or drawing out the heat insulator piece into or from the hollow structure of the supporting bed, it is possible to regulate the radiative heat transmission in the hollow structure and thus control the heat emission.

The invention is characterized in that:

the cooling means cools the supporting bed by circulating therein a cooling medium, and the heat emission controlling means includes:

temperature change detecting means for detecting a temperature change between an inlet and an outlet for the cooling means; and adjusting means for adjusting a flow rate of the cooling medium or an inserting or drawing out degree of the heat insulator, based on the temperature change detected by the temperature change detecting means.

According to the invention, the temperature of the cooling medium which deprives the crucible bottom of heat changes corresponding to the heat emission. By detecting the temperature change between the inlet and outlet for the cooling medium, it is possible to detect a change in the heat emission with a simple manner. Accordingly, the heat emission is easily regulated to be increased or decreased, by increasing or decreasing the flow rate of the cooling medium which deprives the crucible bottom of heat. It is also possible to regulate the heat emission easily by inserting or drawing out the heat insulator piece into or from the hollow structure of the supporting bed, thereby adjusting the heat deprived of from the crucible bottom.

The invention is characterized in that the apparatus further comprises:

heating temperature detecting means for detecting a heating temperature T1 of the crucible subjected to heating by the heating means;

bottom temperature detecting means for detecting a bottom temperature T2 of the under side of the crucible bottom; and control means, in response to outputs of the heating temperature detecting means and the bottom temperature detecting means, for controlling the heating means as to cause the heating temperature T1 to rise to the melting point of the raw semiconductor material or higher, and controlling the heating means as to cause the heating temperature T1 to drop when a rate ΔTa of time-dependent change of the bottom temperature T2 becomes a set value or higher.

Since the raw semiconductor material absorbs heat of melting when it melts, the power of the heating means is controlled by the control means so as to keep the temperature of the crucible constant in the invention. As the melting of the material proceeds, the heat of melting to be lost decreases, which causes the temperature of the crucible, especially the underside of the crucible bottom to rise. Therefore, the change in the bottom temperature T2 of the crucible reflects the melting condition of the raw semiconductor material in the crucible. Thus the rate ΔTa of time-dependent change of the temperature is measured, and as soon as it reaches the set value or higher, the heating of the crucible by the heating means is stopped. This heating temperature control prevents seed crystals spread on the crucible bottom surface from being melted and therefore is desirable especially in the case where the seed crystals are used for growing a semiconductor polycrystal. Then, the crucible starts being gradually cooled and the melted raw semiconductor material is solidified. In the process according to the invention, the semiconductor material is solidified while depriving the crucible bottom of heat, and therefore a polycrystalline semiconductor having grown in one direction from bottom to the top of the crucible can be produced.

A feature of the process according to the invention is that solidifying of the raw semiconductor material by cooling (i.e. growing of crystal) and annealing of the material are executed simultaneously in the solidification process. This can be achieved by changing the heat emission of the raw semiconductor material periodically. Specifically, crystal grows during the period when the heat emission is comparatively high, followed by annealing which occurs during the period when the heat emission is suppressed to a comparatively small level. During the solidification process, these steps are repeated in the course of time and the heat emission is changed periodically. In embodying the process according to this invention, the temperature in the vicinity of the solid-liquid interface (hereinafter referred to as the solid-liquid temperature) of the melted semiconductor material is corrected to as the bottom temperature T2 of the crucible bottom. And the temperature T2 is adjusted in such a manner that the solid-liquid temperature rises and drops within a predetermined range with reference to the melting point of the semiconductor (about 1420° C. for polysilicon, for example), thereby producing a condition of high heat emission and a condition of low heat emission. In this way, according to this invention, the strain stress of the crystal is released at the time of solidification, thereby making it possible to grow a high-quality semiconductor polycrystal with smaller strain stress, having excellent crystallographic properties with a high reproducibility.

Also, the polycrystalline semiconductor is further improved in quality by setting the total length of the time associated with a comparatively large heat emission to not more than ten times the total length of time associated with a comparatively small heat emission during the solidification process.

In the process of producing a polycrystalline semiconductor where the growth of the crystal is started from seed crystals, melting of the seed crystals can be suppressed and a polycrystalline semiconductor of higher quality can be produced when the rate ΔTa of time-dependent change of the bottom temperature T2 of the crucible bottom is set in the range of about 0.2° C./min to about 0.5° C./min. For ΔTa less than 0.2° C./min, not only the seed crystals but the semiconductor material remain unmelted, and it is impossible to produce a semiconductor polycrystal of uniform quality. For ΔTa higher than 0.5° C./min, on the other hand, the seed crystals may melt, thereby making it rather difficult to grow a satisfactory polycrystal.

According to the invention, all the steps of the crystal growth process can be automated. Further, in the case where a polycrystalline semiconductor is grown using seed crystals, the melting of the seed crystals can be suppressed with high reliability, thereby making it possible to produce a high-quality polycrystalline semiconductor. Furthermore, in view of the fact that the crystal growth and annealing are alternatively executed while changing the heat emission of the raw semiconductor material periodically, a polycrystal lower in EPD, small in strain under stress and hard to crack can be produced.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
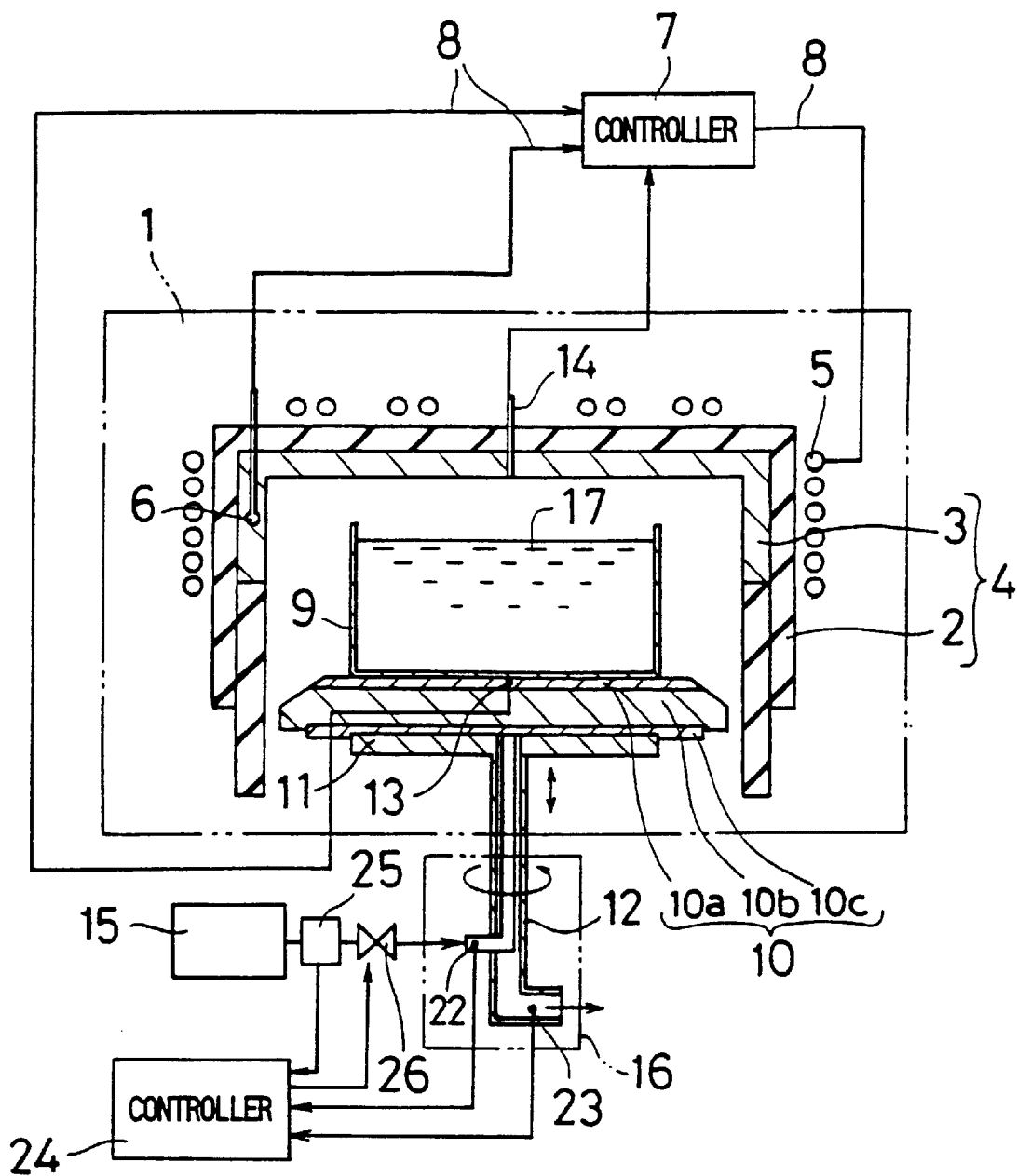
FIG. 1 is a longitudinal sectional view schematically showing a configuration of an apparatus for producing a polycrystalline semiconductor according to the invention.

Now referring to the drawings, preferred embodiments of the invention are described below.

The process and the apparatus for producing polycrystalline semiconductors according to the present invention will now be explained in detail with reference to FIG. 1 through FIG. 8. Although the raw semiconductor material available for use according to the present invention is exemplified by only silicon (Si), other materials such as germanium (Ge) may be used as well in this inventive process.

FIG. 1 is a longitudinal sectional view schematically showing a configuration of an apparatus for producing polycrystalline semiconductors according to a first embodiment of the present invention. This apparatus contains an airtight vessel 1 which prevents passage of air. The airtight vessel 1 may be configured to be connected to an exterior vacuum pump via a vacuum-tight door (not shown) to produce a vacuum inside the vessel. Alternatively, the vessel may be designed so as to internally circulate an inert gas such as argon at normal pressure or at slightly positive pressure, in which case the semiconductor heated to a melt in the airtight vessel 1 is not adversely affected by oxidation, since the atmosphere inside the airtight vessel 1 is non-oxidative.

In the airtight vessel 1 there is provided a cylindrical heating furnace 4 comprising a heat insulator 2 and a heating member 3, located at a distance from the side wall of the vessel. Both the heat insulator 2 and the heating member 3 are made of carbon fibers or graphite, for example. The heating member 3 may be constructed of an electric conductor such as metal. An induction heating coil 5 is wound around the heating furnace 4, particularly along the portion of its outer surface facing the heating member 3. The induction heating coil 5 is energized with a high-frequency current having a frequency of about 10 kHz to thereby heat the heating member 3 by induction. A first thermocouple 6 for measuring a heating temperature T1 which is a temperature of the heating member 3, is inserted in the side wall of the heating member 3 through an installation tube.

The thermocouple 6 and the induction heating coil 5 are connected to a controller 7 provided outside the airtight vessel 8 via respective leads 8. The controller 7 is designed to control power supply to the conduction heating coil 5 in response to output from the thermocouple 6, to thereby increase or decrease the temperature of the heating furnace 4 as desired.

A crucible 9 into which a raw semiconductor material and if necessary, seed crystals are charged, is placed inside the airtight vessel 1. The crucible 9 is placed in the inner space confined by the heating furnace 4 at proper distances from the side wall and the top of the heating furnace 4. The crucible 9 may be made of a silica material or a graphite material, for example; it may also be made of another material such as tantalum, molybdenum, tungsten, silicon nitride or boron nitride. The crucible 9 may be shaped as desired as long as its geometry matches the inner space configuration of the heating furnace 4, and may be selected from cylindrical, square pole or like shape.

Figure 2:
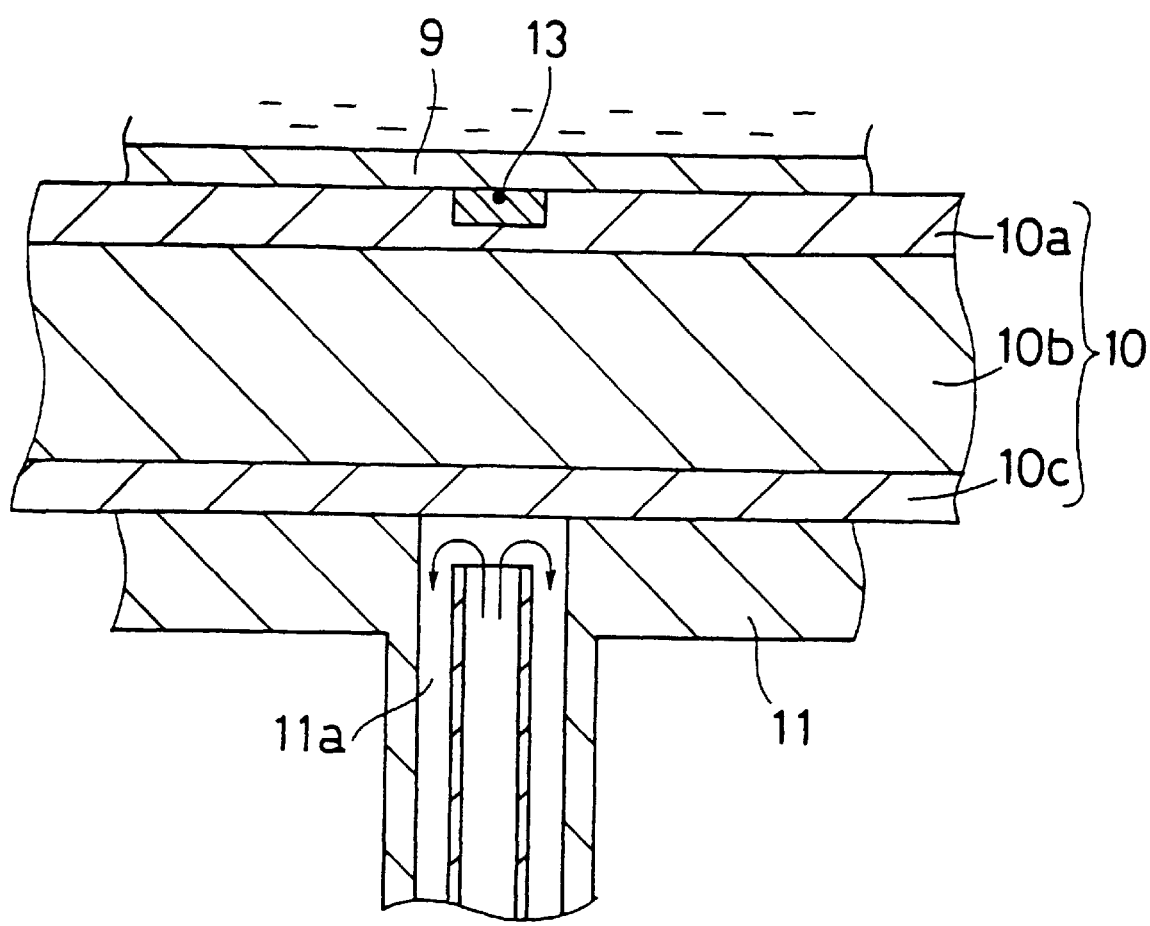
FIG. 2 is an enlarged longitudinal sectional view schematically showing the essential parts of an apparatus for producing a polycrystalline semiconductor according to the invention.

The crucible 9 is placed in the airtight vessel 1, with its bottom mounted and supported on a supporting bed 10. The supporting bed 10 is preferred to have a laminated structure constructed of a surface layer 10a and a bottom layer 10c made of graphite, and an intermediate layer 10b made of carbon fibers. The supporting bed 10 is mounted on a pedestal 11, and the pedestal 11 is mounted on an upper end of a cylindrical member 12 connecting downward from the pedestal 11 to allow the pedestal 11 to rotate about the central longitudinal axis. The rotation of the cylindrical member 12 is propagated to the crucible 9 from the pedestal 11 via the supporting bed 10, and therefore the crucible 9 also rotates as the cylindrical member 12 rotates. When a raw semiconductor material is charged into the crucible 9, and the crucible 9 is heated in the heating furnace 4, the rotation serves to provide the raw semiconductor material in the crucible 9 with an even distribution of temperature As shown in FIG. 2, the pedestal 11 has a hollow double structure and is equipped with a cooling section 11a, and t he cylindrical member 12 is also formed as a double pipe. A cooling medium (f or example, cooling water) is forcedly circulated in the cooling section 11a to cool the supporting bed 10 supported on the pedestal 11. A bottom temperature T2 of the crucible 9 is detected by a second thermocouple 13.

As shown in FIG. 1, a pyrometer 14 is attached to the head of the heating furnace 4, that is, the portion of the heating member 3 located just above the crucible 9. This pyrometer 14 detects the radiant heat of the raw semiconductor material in the crucible 9 to measure the surface temperature of the material. The pyrometer 14 can also detect a difference in the emissivity which depends on whether the raw semiconductor material is in a liquid-phase condition or in a solid-phase condition. Accordingly, the pyrometer 14 is useful to determine the progress of melting of the charged raw semiconductor material while it is heated to a melt, or the progress of solidification of the material while it is cooled to solidity. The output of t he pyrometer 14 is inputted to the controller 7.

The cooling medium is continuously supplied from a cooling medium tank 15 to the cylindrical member 12. As a result, this cooling mechanism allows the supporting bed 10 to exchange heat with the underside of the bottom of the crucible which is in contact therewith to cool the bottom. The pedestal 11 and the cylindrical member 12 are driven to move up or down by driving means 16 provided outside the airtight vessel 1, and the crucible 9 is lifted or lowered in tandem with their upward or downward movement. The distance between the heating furnace 4 and the crucible 9 may be made shorter or longer in this manner. In addition, as mentioned above, the driving means 16 drives the rotation of the cylindrical member 12 about the axis. A raw semiconductor material charged in the crucible 9 is heated from the top of the crucible for melting, and cooled from the bottom of the crucible for solidifying.

A characteristic aspect of the configuration of the producing apparatus according to the invention resides in a second thermocouple 13 which is in contact with the underside of the bottom near the bottom center of the crucible 9, buried in the surface layer 10a of the supporting bed 10. FIG. 2 is an enlarged view of the main portion in the vicinity of a center portion of the bottom of the crucible 9. This thermocouple 13 is used to measure a bottom temperature T1 which is a temperature of the under side of the crucible bottom, and is electrically connected to the controller 7 via a lead in the same manner as the first thermocouple 6. Accordingly, the controller 7 allows control of power supply to the induction heating coil 5 to increase or decrease the temperature of the heating furnace 4 in response to output of the bottom temperature T2 from the second thermocouple 13.

Figure 3:
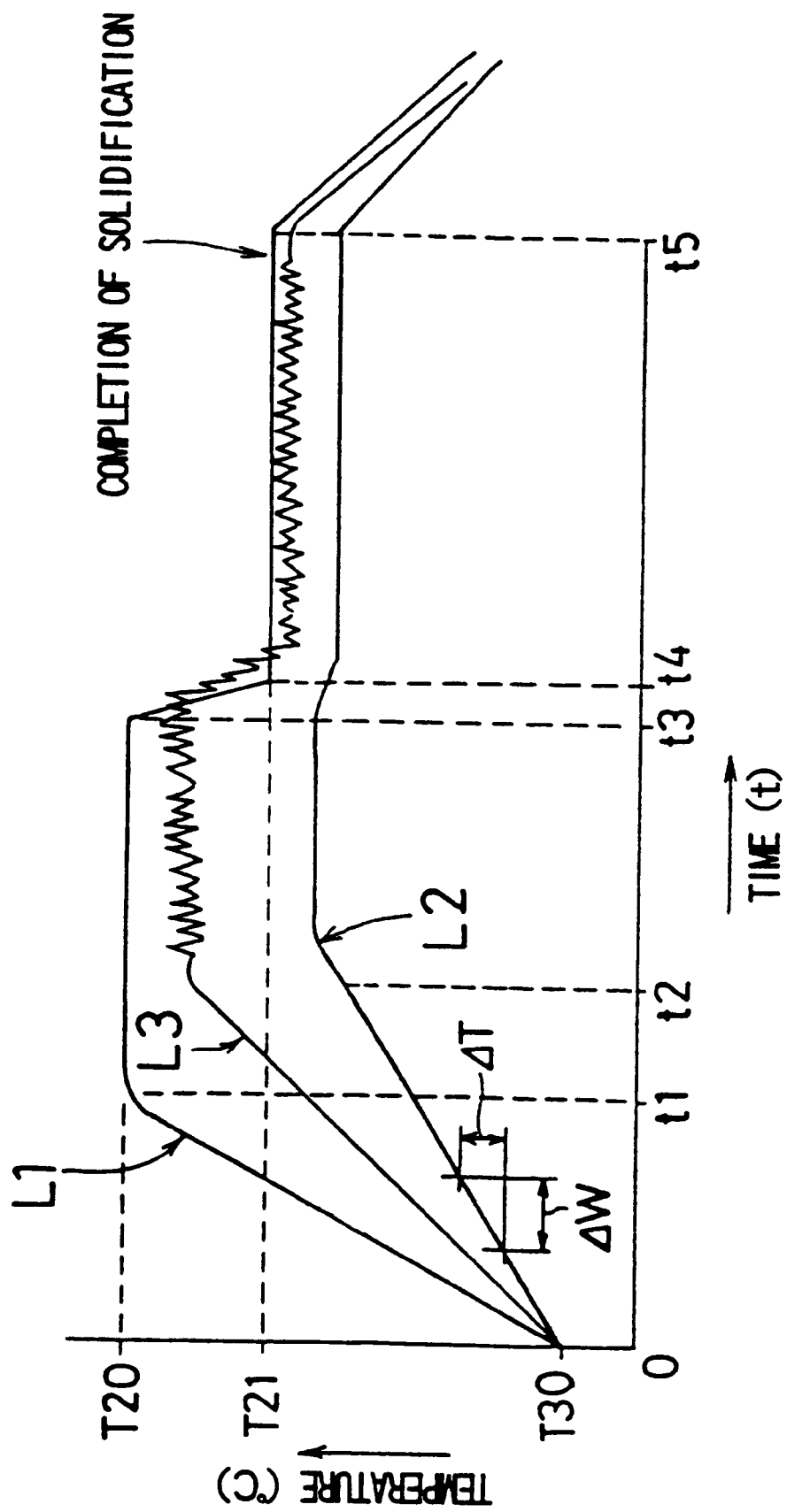
FIG. 3 is a temperature control characteristic diagram showing time-dependent changes in detection temperatures T1, T2 in a first thermocouple 6 and a second thermocouple 13 and an output of a pyrometer 14, in the case where a concept constituting the base of the invention is applied.
Figure 4:
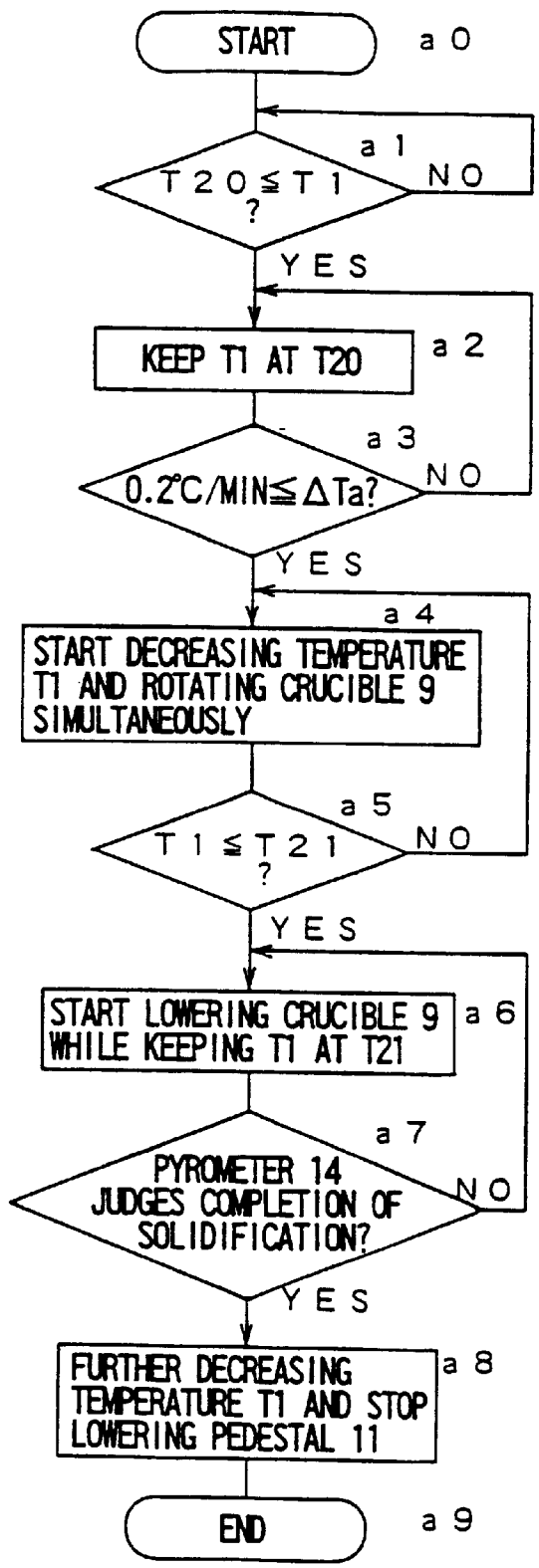
FIG. 4 is a flowchart corresponding to the control operation in FIG. 3.

FIGS. 3 and 4 show a concept of control described in Japanese Patent application No. 7-341136 for a basis of the present invention. FIG. 3 is a graph illustrative of the time-dependent change of the heating temperature T1 and the bottom temperature T2 outputted from the first and second thermocouples 6, 13, respectively. In the graph, L1 indicates the curve of T1, L2 indicates the curve of T2, and L3 indicates the curve of the output from the pyrometer 14. As will be described later, FIG. 4 is a flowchart for explaining the operation of the controller 7 shown in FIG. 1. In response to the output of the heating temperature T1 detected by the first thermocouple 6 and the output of the bottom temperature T2 detected by the second thermocouple 13, the controller 7 executes the steps of FIG. 4 sequentially. Alternatively, it is also possible to track the change of T1 and T2 with time in FIG. 3, for example, instead of referring to a flow chart as shown in FIG. 4, to manually operate the controller 7 for the step of increasing or decreasing the temperature of the heating furnace 4 and the other steps of lifting or lowering the cylindrical member 12, for example.

For keeping the solidification rate constant, the heat emission is required to be changed continuously. In the annealing process after solidification, on the other hand, the heat emission is required to be changed periodically.

Each step of the process for producing a polycrystalline semiconductor constituting a basis of the invention will now be explained in detail with reference to FIGS. 3 and 4. The process starts at step a0, polysilicon which is the raw semiconductor material 17 is charged into the crucible 9. This charging step is preferred to be executed outside the airtight vessel 1 of FIG. 1. The polysilicon-containing crucible 9 is placed on the top surface of the supporting bed 10 mounted on the pedestal 11, with the center of the crucible 9 being aligned with the centers of the pedestal and the supporting bed. The driving means 16 is used to lift the cylindrical member 12 and the pedestal 11, and the crucible 9 is placed at a predetermined location inside the heating furnace 4. Prior to operation of the heating furnace 4, water is circulated through the pedestal 11 and the cylindrical member 12, and it is ascertained whether the bottom, particularly the bottom underside of the crucible 9 is cooled by the cooling mechanism.

In addition, prior to heating of the heating furnace 4, the cylindrical member 12 is rotated about the vertical axis by the driving means 16 to ensure uniform heating of the polysilicon in the crucible 9.

Then, an AC with a frequency of approximately 7 kHz is applied across the induction heating coil 5 at step a1 to initiate its heating when its temperature is T30 (e.g., ambient temperature). The heating to increase the temperature is performed at a temperature gradient of approximately 400° C./hr. until the heating temperature T1 detected by the first thermocouple 6 reaches a setting temperature T20, for example, approximately 1540° C. The elapsed time t1 for reaching the setting temperature from the start of heating is typically about 4.5 hours. Step a1 is repeated so long as determination at step a1 results in a "NO", whereas upon a "YES" result the process proceeds to step a2 where electric power is supplied to the induction heating coil 5 to maintain the heating temperature T1 detected by the first thermocouple 6 at a setting temperature T20 under control by the controller 7. At step a2, the polysilicon in the crucible 9 reaches its melting temperature (approximately 1420° C.), and the melting proceeds from the top to the bottom of the crucible. The progress of melting may be monitored by the pyrometer 14.

Since the cooling medium is circulated through the pedestal 11 as shown in FIG. 2, to cool the supporting bed 10 and further the bottom underside of the crucible, the lower portion, including the bottom, of the crucible is kept at a lower temperature than the upper portion of the crucible. This is also apparent from the sharp leading edges of the gradients L1 and L2 shown in FIG. 3. Since the heating temperature T1 detected by the thermocouple 6 is maintained at the constant value T20 as mentioned above, and the heating through the upper portion and the side wall of the crucible is continuous, the bottom temperature T2 detected by the second thermocouple 13 increases along with the heating temperature T1 detected by the first thermocouple 6, though more slowly.

As shown in FIG. 3, the gradient of L2 becomes flat as the temperature approaches the melting temperature of the silicon. At time t2 about 2.5 hours has elapsed from time t1. Since the polysilicon absorbs heat to melt during the time period subsequent to time t2, the bottom temperature T2 detected by the second thermocouple 13 is prevented from increasing. Therefore, the rate ΔTa (° C./min.) of time-dependent change per unit time ΔW of the bottom temperature T2 is monitored based on the output from the second thermocouple 13, and a point of time (time t3) at which ΔTa reaches a predetermined value (e. g., 0.2° C./min.) or more is detected. Time t3 is 4 hours after time t2, for example. Step 2 is repeated while maintaining the heating temperature T1 at the initial predetermined value T20 so long as determination at step a2 results in a "NO".

Then the process proceeds to the next step a4 to lower the heating temperature T2 at a temperature gradient of 300° C./hr. by the controller 7. Simultaneously, the pedestal 11 is lowered by the driving means 16 at a lowering speed of about 7 mm/hr. The pedestal 11 is preferably rotated at a speed of 1 rpm or less so that the temperature of the melting polysilicon is properly controlled. Through following steps, the crucible 9 is kept rotated. At step a4, the heating temperature T1 is further lowered and when it is determined at step 5 that the temperature has reached the setting temperature T21 (e. g., approximately 1440° C.), at which time the process proceeds to step a6. This time t4 is about 0.3 hours after t3, for example. If the determination result at step a5 is "NO", the process returns to step a4.

At step a6, a power is continuously supplied to the induction heating coil 5 while being controlled by the controller 7 so as to retain the heating temperature T1 detected by the first thermocouple 6 at the setting temperature T21. At step a7, whether or not the solidification step has completed is determined based on the change in the output of the pyrometer 14. If it is determined not completed, the process returns to step a6. The signal level of the output from the pyrometer 14, as seen by curve L3, is subjected to fine fluctuations since the heat emission from the liquid is detected when the silicon is being melted. Upon completion of the solidification, the pyrometer 14 comes to detect the heat emission from the solid material, so that the fine fluctuations are no longer detected in the output signal. Whether the solidification is completed or not is judged by detecting these changes.

If completion of cooling of the silicon is determined at time t5 (e.g. 14 to 17 hrs. after the process starts) at step a7, then the process proceeds to step a8, in which cooling operation is executed at a temperature gradient of about 100° C./hr. so as to lower the heating temperature T1 to the normal temperature. At step a9, after full solidification of the silicon has been ascertained (about 15 hours later), the crucible 9 is taken out of the airtight vessel 1. The produced polysilicon ingot is removed from the crucible 9 to provide polycrystalline silicon which has solidified in a single direction from the bottom to the top of the crucible. Typically, it takes around 40 hours to finish steps al through a9.

The present invention may be very advantageously carried out by presetting the setting temperature T20, the rate ΔTa of time-dependent change and the setting temperature T21, which are referred to at steps a1, a3 and a5, to appropriate values which are inputted to a computer so as to allow subsequent judgment at each step based on whether found values have reached these preset values, and to control the controller 7 in order to carry out the steps of controlling the temperature and cooling in the heating furnace 4.

According to the first embodiment of the invention, the heat emission is continuously or periodically changed by regulating the flow rate of the cooling medium circulating in the pedestal 11 of the producing apparatus. The heat emission is known to be expressed by equation 1 below in the case where the cooling medium is water.

$$\text{heat emission (kW)} = \{\text{flow rate of cooling medium (1/min.)} \times \Delta T(°C.)\}/14.34 \quad (1)$$

ΔT: temperature change between inlet and outlet of cooling medium

Figure 5:
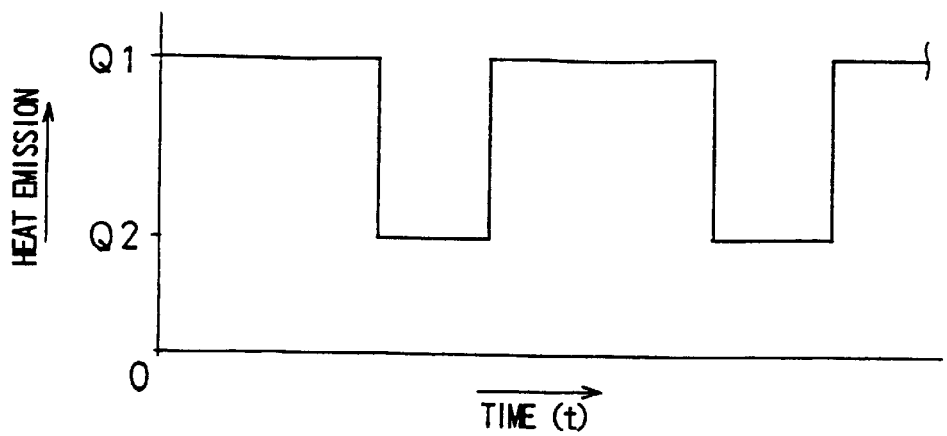
FIG. 5 is a graph showing a relationship between heat emission and time in solidifying and annealing steps under the control according to FIG. 3.

In order to change the heat emission continuously or periodically as intended in the manner described above, a cooling pattern is preset in the solidification process of the raw semiconductor material 17 as shown in FIG. 5, and the flow rate of the cooling medium is continuously changed. For the periodic change, on the other hand, the flow rate of the cooling medium is adjusted to alternate between a setting value Q1 associated with a large heat emission and a setting value Q2 associated with a small heat emission.

In the simplest process for assuring a constant growth rate of crystal according to the invention, the semiconductor in the crucible 9 is heated and melted under substantially the same conditions as the actual conditions intended for semiconductor production, a material of high melting point such as a ceramic rod is inserted into the melted semiconductor material 17 that has begun to solidify, and the position of the solid-liquid interface is recorded with reference to the position of the rod contacting the solid-liquid interface. In accordance with the time-dependent change of the position of the solid-liquid interface thus recorded, a solidification rate is determined. At the same time, an inlet temperature T3 and an outlet temperature T4 of the cooling medium are measured and recorded by third and fourth thermocouples 22 and 23, respectively, shown in FIG. 1. This process is repeated until complete solidification. Since ΔT=T4−T3, once the flow rate of the cooling medium is determined, it is possible to determine the heat emission and the correlation thereof with the solidification rate in accordance with equation 1. In this way, the solidification rate can be controlled based on a temperature difference ΔT between the inlet temperature T3 and the outlet temperature T4 that can be constantly read during the semiconductor production and the flow rate of the cooling medium at that instance.

According to this embodiment, the solidification rate of the semiconductor 17 is controlled at a constant value in terms of the temperature difference ΔT between the inlet temperature T3 and the outlet temperature T4 of the cooling medium. More specifically, it can be said that the heat emission is substantially controlled by changing the quantity of the cooling medium such as cooling water.

Figure 6A:
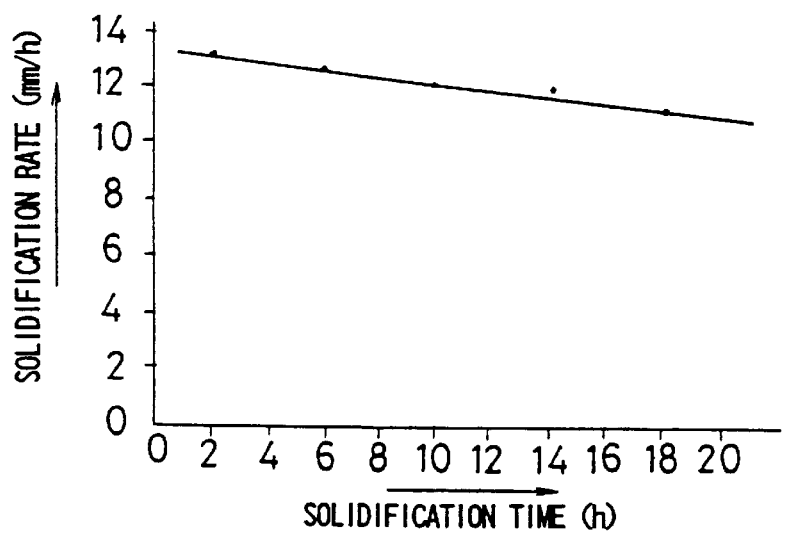
FIGS. 6A and 6B are graphs showing a solidification rate under a condition of constant heat emission, and a solidification process when the solidification rate is controlled to be constant.
Figure 6B:
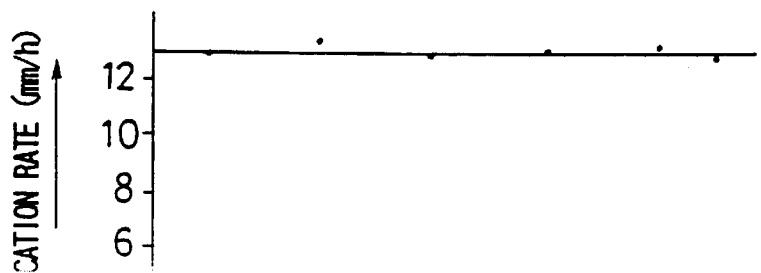

FIG. 6 shows an example of the time-dependent change of the solidification rate. FIG. 6A shows the change in solidification rate with the heat emission kept constant. In the last stages of solidification, unlike in the initial stages thereof, the solid portion constitutes a thermal resistance, and therefore the solidification rate decreases. FIG. 6B shows the result of controlling the solidification rate by changing the quantity of the cooling water and thus continuously changing the heat emission with time while monitoring the temperature difference between the inlet temperature T4 and the outlet temperature T3 of the cooling water. The quantity of the cooling water is continuously changed from 15 (liter/min.) to 20 (liter/min.). Since these conditions are dependent on the size of the crucible 9, the structure of the pedestal 11 or the like, it is necessary to determine optimum conditions for each batch of the semiconductor 17.

Figure 7B:
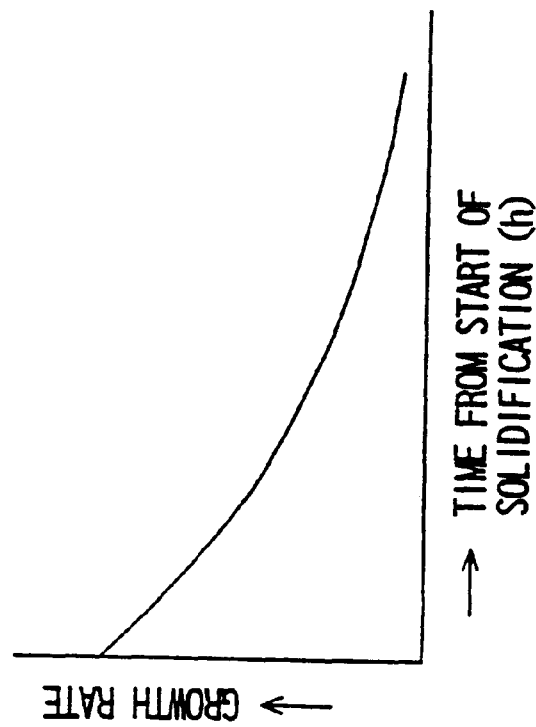
FIGS. 7A and 7B are a diagram schematically showing the manner in which a solid-liquid interface advances at the constant heat emission condition, and a graph showing a time-dependent change in a growth rate.
Figure 7A:
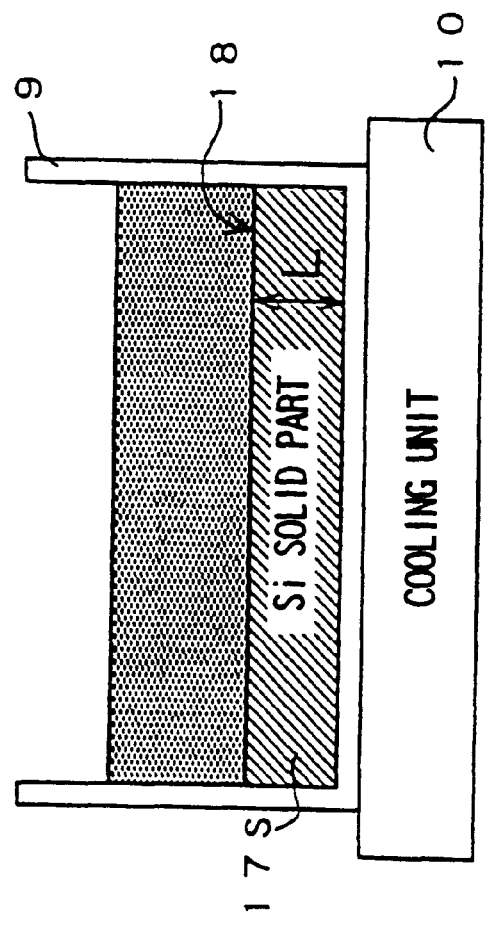

FIG. 7 shows the relationship between the growth rate of crystal and the time. As shown in FIG. 7A, the solid-liquid interface 18 between the solid portion 17S and the melted portion 17L of silicon constituting the semiconductor 17 in the crucible 9 is at the level of length L(t) from the bottom of the crucible, and is a function of the time t. As far as the cooling condition of at the bottom surface of the crucible 9 is constant, as shown in FIG. 7B, the growth rate undergoes a change. For the growth rate, the relationship given by equation (2) below can be assumed.

$$\text{growth rate} \propto \text{heat emission at solid-liquid interface} \quad (2)$$
$$\propto \text{heat conductivity of Si solid} \times$$
$$(\text{bottom area } S \text{ of solid part of silicon}/$$
$$\text{length } L \text{ of solid part of silicon})$$

Consequently, for controlling the growth rate to be constant, it is required to keep the heat emission at the solid-liquid interface constant. Assume that the change rate of heat emission at the cooling unit is ΔH(t) and the heat conductivity of the Si solid is δ. Then, equation (3) below is required to be satisfied.

$$\Delta H(t) \times \sigma \times \frac{S}{L(t)} = A \text{ (constant)} \tag{3}$$

In this equation, A is a constant dependent on the size and the cooling performance of the crucible 9. From equation (3), equation (4) below can be obtained.

$$\Delta H(t) = A/(\delta \times S) \times L(t) \tag{4}$$

Figure 8:
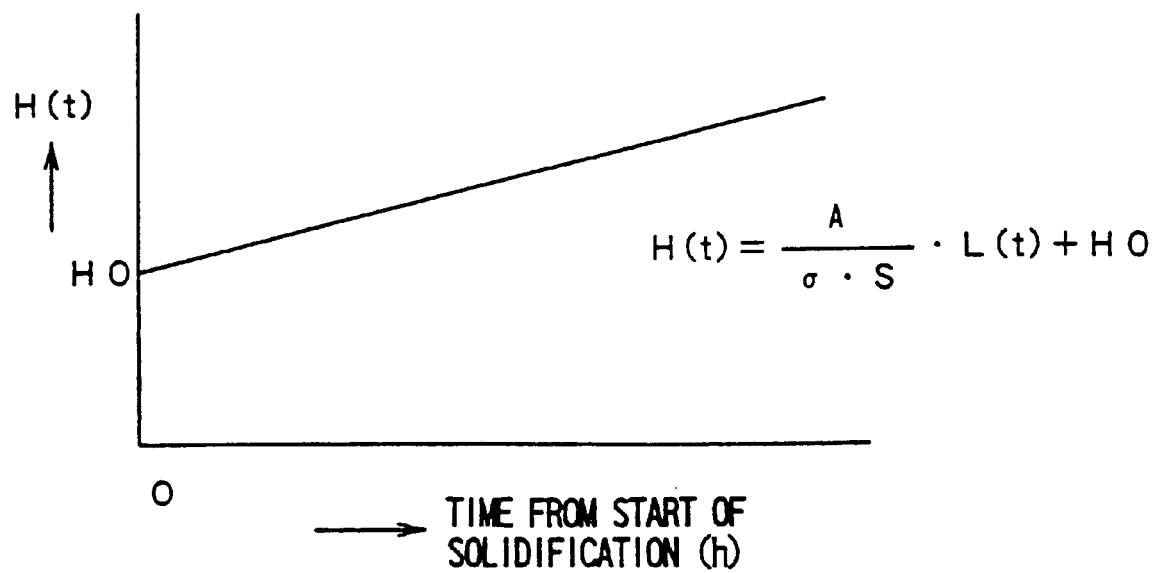
FIG. 8 is a graph showing the manner in which the heat emission is changed with time according to a first embodiment of the invention.

As far as L(t), i.e. the growth rate is constant, the change ΔH(t) of heat emission also remains constant with time. As a result, as shown in FIG. 8, the heat emission H(t) is required to be increased as a linear function of time.

Figure 9:
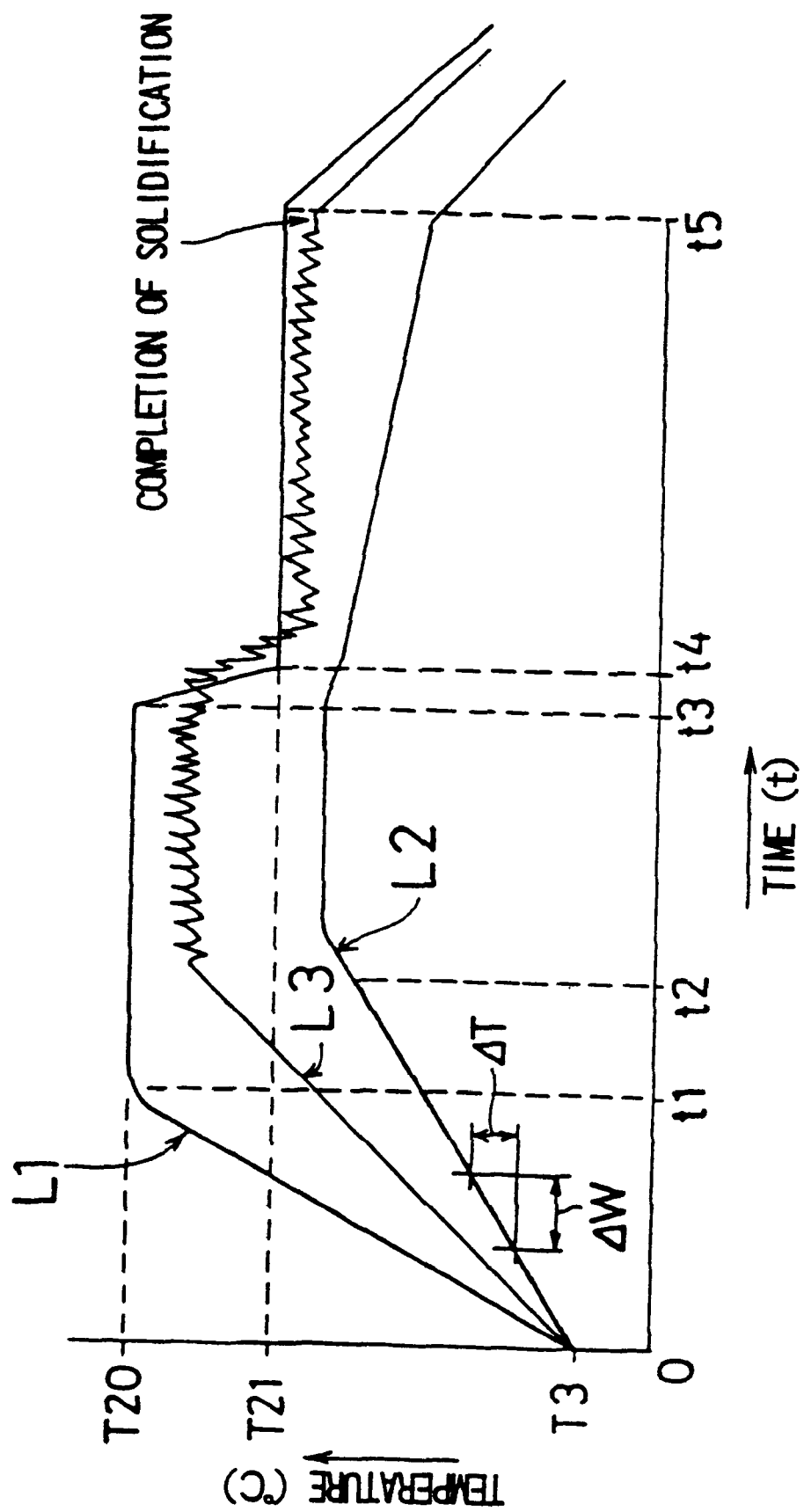
FIG. 9 is a temperature control characteristic diagram showing time-dependent changes in the detection temperatures T1, T2 of the first and second thermocouples 6, 13 and the output of the pyrometer 14 according to the first embodiment of the invention.
Figure 10:
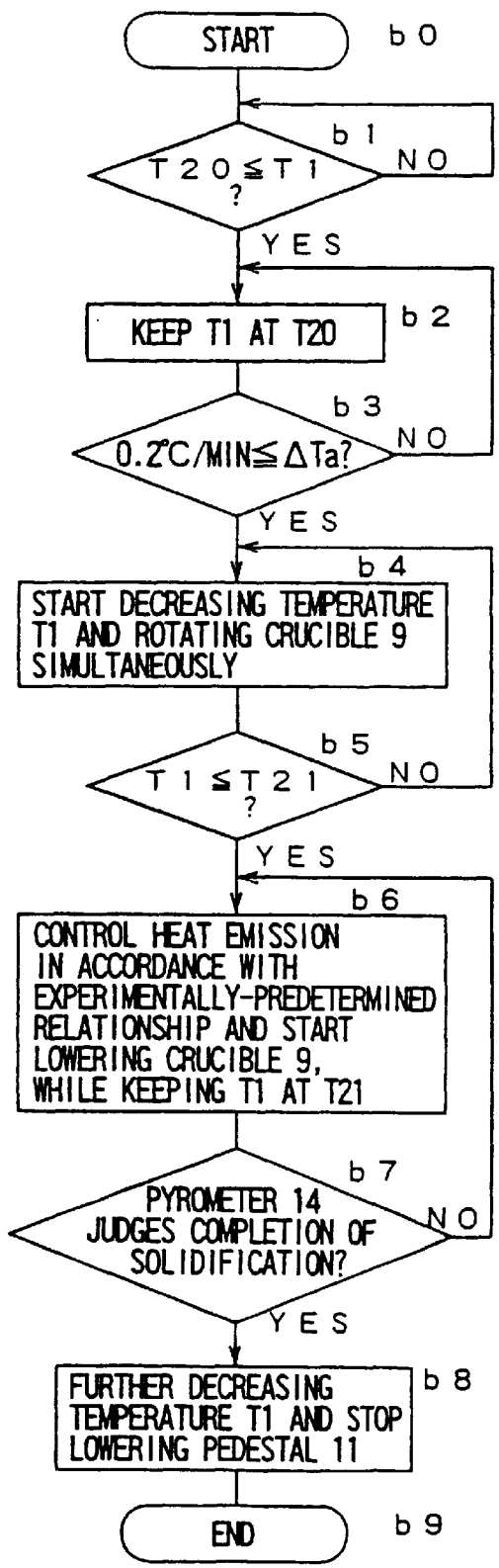
FIG. 10 is a flowchart corresponding to the control operation in FIG. 9 according to the first embodiment of the invention.

FIG. 9 shows a temperature control characteristic according to this embodiment, and FIG. 10 is a flowchart for the temperature control. The process up to time t4 in FIG. 9 is basically similar to the corresponding process of FIG. 3. Also, steps b0 to b5 and steps b7 to b9 in FIG. 10 are equivalent to steps a0 to a5 and a7 to a9 in FIG. 4, respectively. According to this embodiment, the heat emission H(t) is controlled during the period from t4 to t5 in FIG. 9 in accordance with a empirically-predetermined relationship, thereby assuring a constant solidification rate, i.e. a constant crystal growth rate. This relationship can be approximated by a linear function increasing linearly as shown in FIG. 8. The control operation according to a linear function simplifies the control process.

From the beginning of the solidification, the flow rate of the cooling medium is controlled in accordance with the empirically-determined relationship between the solidification rate and the heat emission calculated from the temperature difference ΔT between the inlet and outlet of the cooling medium and the flow rate of the cooling medium at the instance, thereby keeping the solidification rate constant throughout the solidification process.

As shown in FIG. 1, for example, the quantity of the cooling water constituting a cooling medium is controlled according to a program set in the controller 24 in advance. The inlet temperature T3 and the outlet temperature T4 of the cooling water and the water quantity detected by a cooling water meter 25 are applied to the controller 24, and the opening degree of a solenoid valve 26 can be controlled while monitoring the temperature difference. This leads to a great advantage that a constant solidification rate can be automatically secured.

The heat emission, which can be appropriately controlled by changing the flow rate of the cooling medium, can alternatively be controlled by changing the cooling medium itself. For this purpose, the cooling mechanism can be configured of two or more systems between which the cooling mediums are switched to each other by opening/closing the solenoid valve. For the cooling mediums used in the above configuration, an appropriate combination of water, helium gas, carbon dioxide, etc. is selected. By using such combination of cooling mediums alternatively, it is possible to control the heat depriving effect of the cooling medium.

Figure 11:
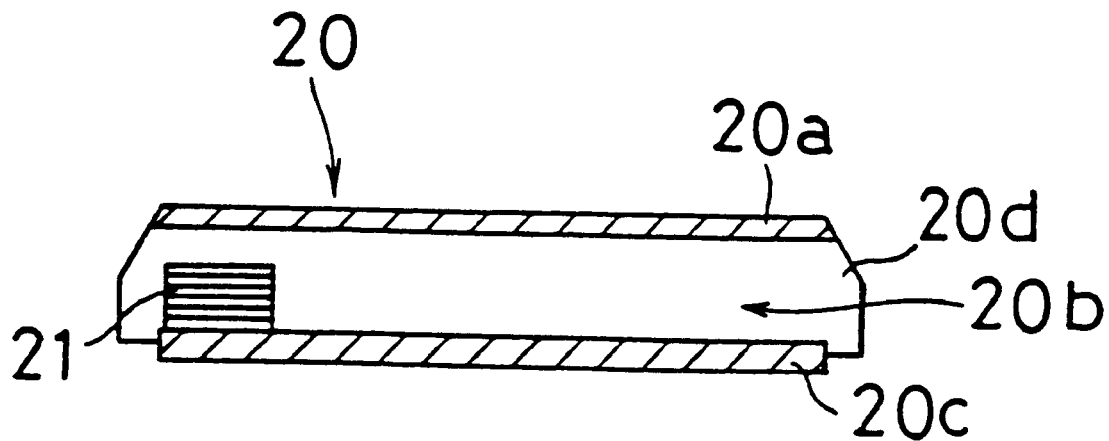
FIG. 11 is a longitudinal sectional view showing an example of a hollow structure of a supporting bed 20 used in a second embodiment of the invention.
Figure 12:
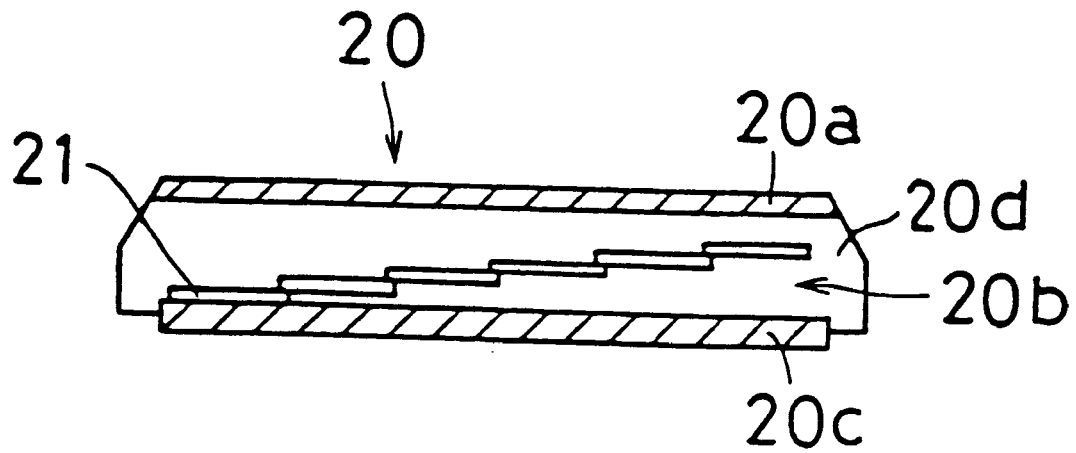
FIG. 12 is a longitudinal sectional view showing a heat insulator piece 21 extended in the hollow structure of the supporting bed 20 of FIG. 11.

FIGS. 11 and 12 show configurations of a supporting bed 20 of a polycrystalline semiconductor production apparatus according to a second embodiment of the invention. The production apparatus according to this embodiment has substantially the same elements as those of the apparatus according to the first embodiment, except for the supporting bed 10. The production apparatus according to this embodiment is different from that of the first embodiment, however, in that the supporting bed 20 has a hollow structure into or from which a heat insulator piece 21 can be inserted or drawn out. The supporting bed 20 includes a surface layer 20a, a hollow section 20b and a bottom layer 20c. The surface layer 20a, the bottom layer 20c and a side wall 20d are formed of graphite, while leaving the hollow section 20b.

According to this embodiment, when the bottom of the crucible 9 is deprived of heat by the cooling of the supporting bed 20 for causing the solidification to proceed, heat is transmitted in the hollow section 20b by radiation. In view of this, insertion of the heat insulator piece 21 for blocking the radiation into the hollow section 20b can suppress the cooling of the crucible 9 from the under side of its bottom. The heat insulator piece 21 usable for this purpose is preferably formed of one or more materials selected from the groups of gold, platinum, silver, tungsten, carbon fiber and tantalum. Nevertheless, other than the above-mentioned materials with high radiation efficiencies and high melting points can be used with equal effect. The heat insulator piece 21 may be formed into a simple metal plate, or otherwise to be a multilayered structure which is of a slide type and extendable as shown in FIGS. 11 and 12. This kind of heat insulator piece 21 is inserted into the hollow section 20b and extended, with the result that the heat insulator piece 21 block the heat radiation between the surface layer 20a and the bottom layer 20c of the supporting bed 20 as shown in FIG. 12. At this time, minimum heat mission is achieved. On the other hand, maximum heat emission is achieved by removing the heat insulator piece 21 or shortening the same as shown in FIG. 11.

Figure 13:
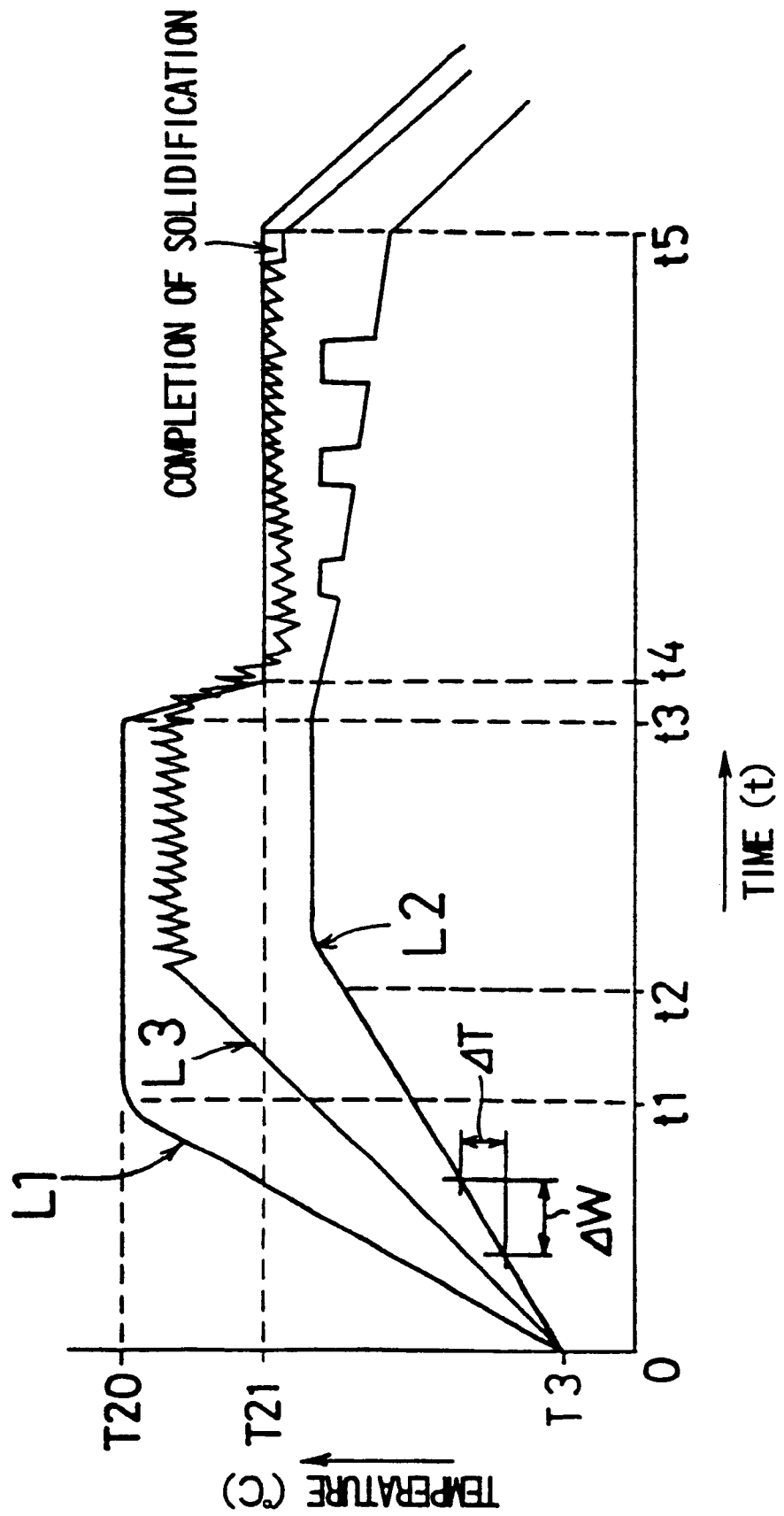
FIG. 13 is a temperature control characteristic diagram showing time-dependent changes in the detection temperatures T1, T2 of the first and second thermocouples 6, 13 and the output of the pyrometer 14 according to a third embodiment of the invention.
Figure 14:
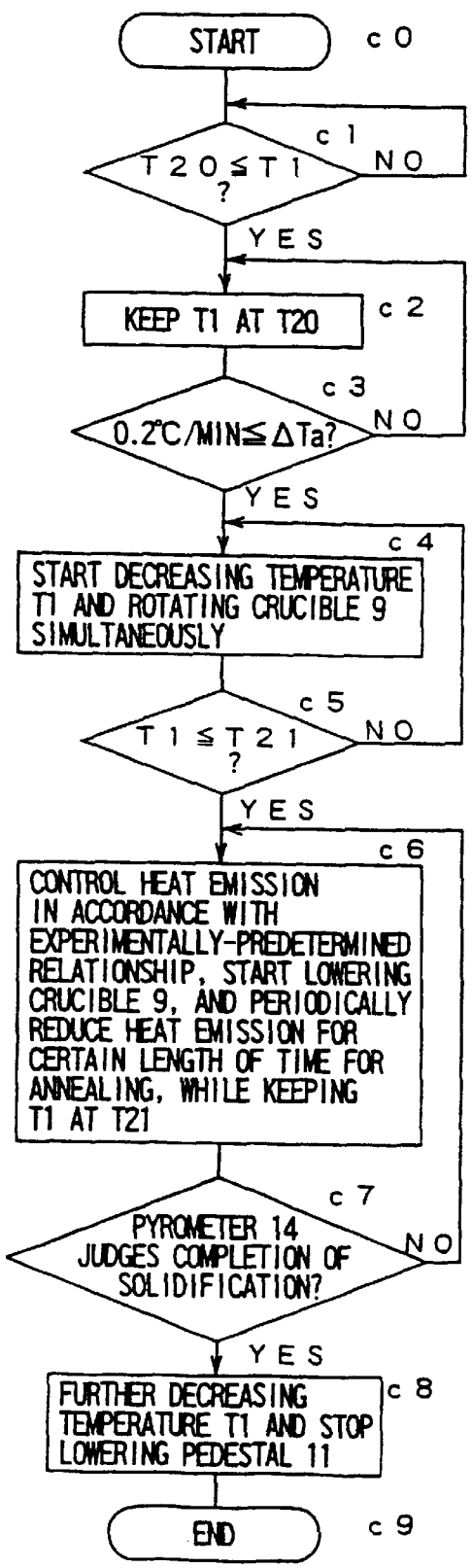
FIG. 14 is a flowchart corresponding to the control operation of FIG. 13 according to the third embodiment of the invention.

FIG. 13 shows a temperature control characteristic according to a third embodiment of the invention, and FIG. 14 a flowchart for the temperature control operation. The process up to time t4 in FIG. 13 is basically equivalent to that of FIGS. 3 and 9. Also, steps c0 to c5 and steps c7 to c9 in FIG. 14 are equivalent to steps a0 to a5 and steps a7 to a9 in FIG. 4, and steps b0 to b5 and steps b7 to b9 in FIG. 1, respectively. According to this embodiment, the heat emission H(t) is controlled during the period from time t4 to time t5 of FIG. 9 in accordance with a relationship predetermined experimentally while the annealing process is carried out at the same time. For annealing, the quantity of the cooling water constituting a cooling medium is controlled, and when the solid-liquid interface temperature measured as the heating temperature T1 reaches 1422° C., for example, the cooling water flow rate is held as it is for an optimum length of time. Then, the flow rate of the cooling water is restored to the level satisfying the conditions for assuring a constant solidification rate as in the first embodiment. In step c6 of FIG. 14, annealing and the solidification of the material are alternatively repeated by decreasing the heat emission at regular time intervals for a predetermined length of time, while the crucible 9 is moved down for proceeding the solidification.

Figure 15:
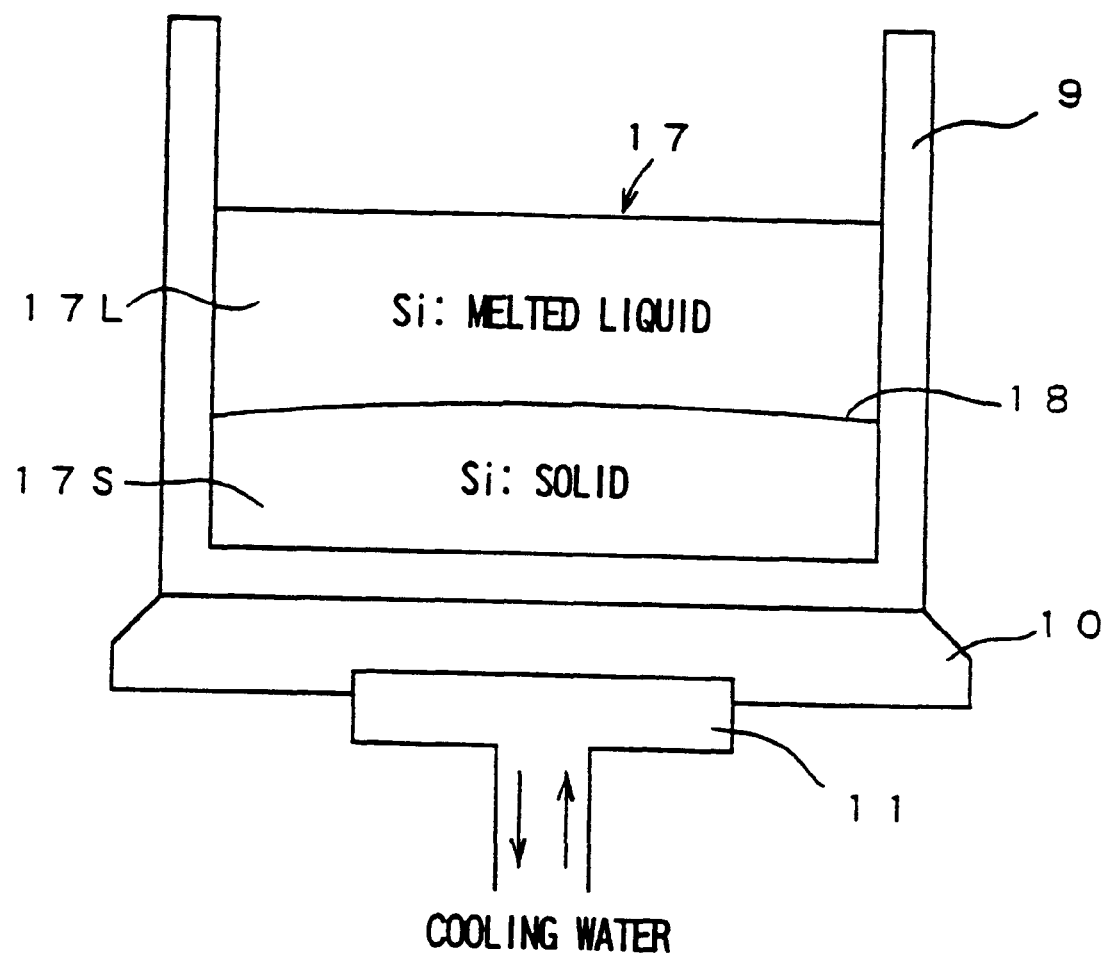
FIG. 15 is a diagram schematically showing a solid-liquid interface formed when the solidification and the annealing are alternated repeatedly according to the third embodiment of the invention.

FIG. 15 is a schematic diagram showing the state of the solid-liquid interface when the annealing and the solidification are alternatively repeated according to the present embodiment. The silicon constituting the raw semiconductor material 17 in the crucible 9 includes a melted liquid part 17L, a solid part 17S under the liquid part 17L and a solid-liquid interface 18 formed between the both parts 17S and 17L. During the solidification process, the control takes place so that the solid-liquid interface 18 advances upward at a constant rate. is controlled to proceed upward at a constant rate. During the annealing process, on the other hand, the solid-liquid interface 18 is temporarily stopped to move, and under this condition, the internal strain accumulated in the solid part 17S of silicon is released toward the upper surface.

EXAMPLE

Silicon seeds (CZ(100), 5 inches in diameter and 10 mm in thickness) were placed on the bottom center of a crucible (a square pole 55 cm in width and 40 cm in height). Preferably silicon seeds pre-treated by chemical etching (30 $\mu$m) are used. The etching provides smoother crystal surfaces suitable for crystal growth. Approximately 140 kg of polysilicon to be melted was charged into the crucible.

According to the third embodiment of the invention, steps c0 to c7 in FIG. 14 were executed to produce a polycrystalline silicon ingot. In this embodiment, the solid-liquid interface temperature is maintained at 1421° C. while linearly increasing the heat emission with respect to the solidification time in step c6. The time ratio between solidification and annealing in step c6 is about 5. The solidification process (steps c6 and c7) requires about 20 hours. The EPD of the polycrystalline silicon ingot produced by a production test was measured and the quality was evaluated. The EPD was measured in accordance with JIS H0609. The EPD measurement and the conversion efficiency for a working model of a solar battery cell are shown in Table 1. By way of comparison, also two cases were evaluated, one with the solidification rate fixed without any annealing process as according to the first embodiment of the invention, and the other with the heat emission fixed while the solidification rate is varied as shown in FIG. 3.

TABLE 1

| Production condition | EPD ($\times 10^4/cm^2$) | conversion efficiency of solar cell (%) |
| --- | --- | --- |
| constant solidification rate + annealing | 0.8 | 15.0 |
| constant solidification rate | 2.0 | 14.5 |
| variable solidification rate | 15.0 | 13.5 |

As apparent from these examples of production tests, the polycrystalline silicon ingot produced according to the present example is characterized by a lower EPD than the comparative examples, and a superior polycrystalline ingot with an improved EPD is produced.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A process for producing a polycrystalline semiconductor comprising the steps of:
   charging a raw semiconductor material into a crucible in an atmosphere inert to the semiconductor;
   heating and melting the raw semiconductor material in the crucible by heating means;
   solidifying the melted raw semiconductor material while depriving the bottom of the crucible of heat; and then
   cooling the solidified semiconductor while cooling the crucible,
   wherein a relationship between heat emission and solidification rate at which rate a solid-liquid interface of the raw semiconductor material moves is previously determined, and
   when solidifying the melted raw semiconductor material, a heat emission is changed with time according to the predetermined relationship so as to keep the solidification rate constant.

2. The process for producing a polycrystalline semiconductor of claim 1, wherein solidification at the constant rate and annealing are alternatively executed during the solidifying step.

3. The process for producing a polycrystalline semiconductor of claim 1, wherein the change in the heat emission is controlled on the basis of a detection value of a temperature change between an inlet and an outlet for a cooling medium which deprives the crucible bottom of heat.

4. The process for producing a polycrystalline semiconductor of claim 1, wherein the change in the heat emission is controlled so that the heat emission increases from initial stages toward last stages of the solidifying step.

5. The process for producing a polycrystalline semiconductor of claim 4, wherein the increasing of the heat emission is controlled in accordance with a linear function.

6. The process for producing a polycrystalline semiconductor of claim 1, wherein the change in the heat emission is controlled by regulating a flow rate of a cooling medium which deprives the crucible bottom of heat.

7. The process for producing a polycrystalline semiconductor of claim 1, wherein the bottom of the crucible is placed on a supporting bed having a hollow structure, whereby the change in the heat emission is controlled by regulating heat to be deprived from the crucible bottom by inserting into or drawing out from the hollow structure, or beat insulator piece.

8. The process for producing a polycrystalline semiconductor of any one of claims 1 to 7, wherein semiconductor seed crystals are placed on the bottom of the crucible before charging the raw semiconductor material into the crucible, whereby the polycrystal is grown from the seed crystals at the time of solidification.

9. The process for producing a polycrystalline semiconductor of claim 1, wherein the raw semiconductor material is polysilicon and the polycrystalline semiconductor is polycrystalline silicon.

10. An apparatus for producing a polycrystalline silicon semiconductor comprising:
    an airtight vessel capable of keeping therein an atmosphere inert to the semiconductor;
    a crucible arranged in the airtight vessel, into which a raw semiconductor material is charged;
    heating means for heating the crucible at upper portions of a bottom of the crucible to melt the raw semiconductor material;
    a supporting bed for mounting the crucible thereon by supporting an under side of the bottom of the crucible;
    cooling means for cooling the supporting bed;
    driving means for driving the supporting bed so as to rotate about a vertical axis, as well as to move up or down; and
    heat emission controlling means for controlling a heat emission in accordance with a relationship between solidification rate and heat emission so as to keep the solidification rate constant at the time of solidification of the raw semiconductor material.

11. The apparatus for producing a polycrystalline silicon semiconductor of claim 10, wherein the supporting bed has a hollow structure into which a heat insulator can be inserted or from which the heat insulator can be drawn out.

12. The apparatus for producing a polycrystalline silicon semiconductor of claim 11, wherein the heat insulator is formed from one or more materials selected from the group consisting of gold, platinum, silver, tungsten, carbon fiber and tantalum.

13. The apparatus for producing a polycrystalline silicon semiconductor of claim 10 or 11, wherein the cooling means cools the supporting bed by circulating therein a cooling medium, and the heat emission controlling means includes:
   temperature change detecting means for detecting a temperature change between an inlet and an outlet for the cooling means; and
   adjusting means for adjusting a flow rate of the cooling medium or an inserting or drawing out degree of the heat insulator, based on the temperature change detected by the temperature change detecting means.

14. The apparatus for producing a polycrystalline silicon semiconductor of any one of claims 10 to 13, further comprising:

heating temperature detecting means for detecting a heating temperature T1 of the crucible subjected to heating by the heating means;

bottom temperature detecting means for detecting a bottom temperature T2 of the under side of the crucible bottom; and control means, in response to outputs of the heating temperature detecting means and the bottom temperature detecting means, for controlling the heating means as to cause the heating temperature T1 to rise to the melting point of the raw semiconductor material or higher, and controlling the heating means as to cause the heating temperature T1 to drop when a rate $\Delta Ta$ of time-dependent change of the bottom temperature T2 becomes a set value or higher.

15. The apparatus for producing a polycrystalline silicon semiconductor of claim 10, wherein the crucible is made from a material selected from the group consisting of silica, graphite, tantalum, molybdenum, tungsten, silicon nitride and boron nitride.

16. The apparatus for producing a polycrystalline silicon semiconductor of claim 10, wherein the atmosphere is argon.

17. The apparatus for producing a polycrystalline silicon semiconductor of claim 10, wherein the airtight vessel is connected to an exterior vacuum pump.

18. The apparatus for producing a polycrystalline silicon semiconductor of claim 13, wherein the cooling medium is water.

19. The apparatus for producing a polycrystalline silicon semiconductor of claim 10, wherein the heating means comprises a heating furnace which comprises:

a heating member located at a distance from a side wall of the vessel;

a heat insulator located outside the heating member; and an induction coil located outside the heating member.

20. The apparatus for producing a polycrystalline silicon semiconductor of claim 19, wherein the heat insulator is made from carbon fibers or graphite.

21. The apparatus for producing a polycrystalline silicon semiconductor of claim 19, wherein the heating member is constructed from an electric conductor.

* * * * *